(12) United States Patent
Taylor et al.

(10) Patent No.: US 8,945,964 B2
(45) Date of Patent: Feb. 3, 2015

(54) FABRICATION OF NITRIDE NANOPARTICLES

(75) Inventors: Peter Neil Taylor, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 134 days.

(21) Appl. No.: 13/145,385

(22) PCT Filed: Jan. 26, 2010

(86) PCT No.: PCT/JP2010/051315
§ 371 (c)(1),
(2), (4) Date: Jul. 20, 2011

(87) PCT Pub. No.: WO2010/085001
PCT Pub. Date: Jul. 29, 2010

(65) Prior Publication Data
US 2012/0018774 A1    Jan. 26, 2012

(30) Foreign Application Priority Data

Jan. 26, 2009 (GB) .................................. 0901226.1

(51) Int. Cl.
*C09K 11/08* (2006.01)
*C30B 7/06* (2006.01)
*B82Y 30/00* (2011.01)
(Continued)

(52) U.S. Cl.
CPC . *C30B 7/06* (2013.01); *B82Y 30/00* (2013.01); *C01B 21/06* (2013.01); *C01B 21/0632* (2013.01); *C09K 11/025* (2013.01); *C09K 11/62* (2013.01); *C30B 29/38* (2013.01); *C30B 29/403* (2013.01); *C30B 29/60* (2013.01); *C01B 21/064* (2013.01); *C01B 21/068* (2013.01); *C01B 21/072* (2013.01); *C01P 2002/72* (2013.01); *C01P 2004/04* (2013.01); *C01P 2004/64* (2013.01); *C01P 2004/84* (2013.01); *Y10S 977/773* (2013.01); *Y10S 977/816* (2013.01)

USPC ............................. 438/46; 977/773; 977/816

(58) Field of Classification Search
None
See application file for complete search history.

(56) References Cited

U.S. PATENT DOCUMENTS 7,399,429 B2 * 7/2008 Liu et al. ................ 252/301.4 R
7,867,557 B2   1/2011 Pickett et al.
(Continued)

FOREIGN PATENT DOCUMENTS

JP    2004-307679 A    11/2004
JP    2005-101601 A    4/2005
(Continued)

OTHER PUBLICATIONS

Office Action issued on Nov. 2, 2012 for co-pending U.S. Appl. No. 13/145,650.
(Continued)

*Primary Examiner* — Johannes P Mondt
(74) *Attorney, Agent, or Firm* — Renner, Otto, Boisselle & Sklar, LLP

(57) ABSTRACT

A method of manufacturing a nitride nanoparticle comprises manufacturing the nitride nanostructure from constituents including: a material containing metal, silicon or boron, a material containing nitrogen, and a capping agent having an electron-accepting group for increasing the quantum yield of the nitride nanostructure. Nitride nanoparticles, for example nitride nanocrystals, having a photoluminescence quantum yield of at least 1%, and up to 20% or greater, may be obtained.

22 Claims, 11 Drawing Sheets

(51) Int. Cl.
*C01B 21/06* (2006.01)
*C09K 11/02* (2006.01)
*C09K 11/62* (2006.01)
*C30B 29/38* (2006.01)
*C30B 29/40* (2006.01)
*C30B 29/60* (2006.01)
*C01B 21/064* (2006.01)
*C01B 21/068* (2006.01)
*C01B 21/072* (2006.01)

(56) References Cited

U.S. PATENT DOCUMENTS

| | | | |
|---|---|---|---|
| 2005/0004293 | A1 | 1/2005 | Peng et al. |
| 2005/0051769 | A1 | 3/2005 | Jang et al. |
| 2005/0220694 | A1 | 10/2005 | Winkler et al. |
| 2006/0001119 | A1 | 1/2006 | Liu et al. |
| 2006/0014040 | A1 | 1/2006 | Peng et al. |
| 2006/0087048 | A1 | 4/2006 | Mello et al. |
| 2006/0240227 | A1 | 10/2006 | Zhang et al. |
| 2007/0064468 | A1 | 3/2007 | Seol et al. |
| 2007/0111324 | A1 | 5/2007 | Nie et al. |
| 2007/0111488 | A1 | 5/2007 | Chakraborty et al. |
| 2007/0297969 | A1 | 12/2007 | Van Patten et al. |
| 2008/0020383 | A1 | 1/2008 | Koshy et al. |
| 2008/0173845 | A1 | 7/2008 | Ryowa et al. |
| 2008/0231170 | A1 | 9/2008 | Masato et al. |
| 2008/0237612 | A1 | 10/2008 | Cok |
| 2009/0047773 | A1 | 2/2009 | Mitchell et al. |
| 2009/0061226 | A1 | 3/2009 | Banin et al. |
| 2010/0283005 | A1 | 11/2010 | Pickett et al. |
| 2013/0178047 | A1 | 7/2013 | Harris et al. |

FOREIGN PATENT DOCUMENTS

| | | |
|---|---|---|
| JP | 2007-070207 A | 3/2007 |
| JP | 2007-077246 A | 3/2007 |
| JP | 2007-514133 A | 5/2007 |
| JP | 2008-94968 A | 4/2008 |
| JP | 2009-013283 A | 1/2009 |
| WO | 01/52741 A1 | 7/2001 |
| WO | 03/054953 A1 | 7/2003 |
| WO | 2005/001906 A2 | 1/2005 |
| WO | 2005/110916 A2 | 11/2005 |
| WO | 2006/027778 A2 | 3/2006 |
| WO | 2007/020416 A1 | 2/2007 |
| WO | 2008/094292 A1 | 8/2008 |
| WO | 2009/040553 A2 | 4/2009 |

OTHER PUBLICATIONS

International Search Report for corresponding International Application No. PCT/JP2010/051315 mailed Mar. 9, 2010.
Form PCT/ISA/237 for International Application No. PCT/JP2010/051315 dated Mar. 9, 2010.
British Search Report for corresponding British Application No. GB0901226.1 dated Apr. 7, 2009.
Alivisatos et al., "Synthesis of Soluble and Processable Rod-, Arrow-, Teardrop-, and Tetrapod-Shaped CdSe Nanocrystals", J. Am. Chem. Soc., 2000, 122, 12700.
Peng et al., "Control of Photoluminescence Properties of CdSe Nanocrystals in Growth", J. Am. Chem. Soc., 2002, 124. 2049.
Battaglia et al., "Formation of High Quality InP and InAs Nanocrystals in a Noncoordinating Solvent", Nano Letters, 2002, 2, 1027.
Li et al., "One-Pot Synthesis of Highly Luminescent InP/ZnS Nanocrystals Without Precursor Injection", J. Am. Chem. Soc., 2008, 130, 11588.
Neumayer et al., "Growth of Group III Nitrides. A Review of Precursors and Techniques", Chem. Mater., 1996, 8, 25.
Mićić et al., "Synthesis, Structure, and Optical Properties of Colloidal GaN Quantum Dots", Appl. Phys. Lett., 1999, 74, 478.
Cumberland et al., "Thermal control of Metathesis Reactions Producing GaN and InN", J. Phys. Chem. B., 2001, 105(47), pp. 11922-11927.
Co-pending U.S. Appl. No. 13/145,650, filed Jul. 21, 2011 (current claims and application provided).
International Search Report for corresponding International Application No. PCT/JP2010/051316 mailed Mar. 2, 2010.
British Search Report for corresponding British Application No. GB0901225.3 dated Apr. 15, 2009.
Skoog et al., "Principles of Instrumental Analysis", Fifth Edition, Saunders College Publishing, pp. 360-361, 1998.
L. E. Brus, "A Simple Model for the Ionization Potential, Electron Affinity, and Aqueous Redox Potentials of Small Semiconductor Crystallites", J. Chem. Phys. vol. 79, No. 11, Dec. 1983, pp. 5566-5571.
Dabbousi et al., "(CdSe)ZsN Core—Shell Quantum Dots: Synthesis and Characterization of a Size Series of Highly Luminescent Nanocrystallites", J. Phys. Chem, B. 1997, 101, 9463.
Murray et al., "Synthesis and Characterization of Nearly Monodisperse CdE (E=S, Se, Te) Semiconductor Nanocrystallites", J. Am. Chem. Soc., 1993, 115, 8706.
Choi et al., "Low-temperature solvothermal synthesis of nanocrystalline indium nitride and Ga—In—N composites from the decomposition of metal azides", J. Mater. Chem., 2006, 38, 3774.
Pan et al., "New Pyrolysis Route to GaN Quantum Dots", Chemistry of Materials, 2006, 18, 3915.
Gerbec et al., "Microwave-Enhanced Reaction Rates for Nanoparticle Synthesis", J. Am. Chem. Soc., 2005, 127, 15791.
Wu et al., "Indium nitride from Indium Iodide at Low Temperatures: Synthesis and Their Optical Properties", New J. Chem., 2005, 29, 1610.
Schofield et al., "Nanoparticles from the Decomposition of the Complex", J. Mater. Chem., 2004, 14, 3124.
Sardar et al., "InN Nanocrystals, Nanowires, and Nanotubes", Small, 2005, 1, 91.
Office Action issued on Apr. 17, 2013 for co-pending U.S. Appl. No. 13/145,650.
Notice of Allowance issued on Jul. 26, 2013 for co-pending U.S. Appl. No. 13/145,650.

* cited by examiner

M = any metal, boron or silicon
$X_1, X_2, ... X_n$ = any electron donating functional group
$Y_1, Y_2, ... Y_n$ = any electron accepting functional group

FABRICATION OF NITRIDE NANOPARTICLES

TECHNICAL FIELD

This invention relates to fabrication of semiconductor nanoparticles, for example nanocrystals, having nanometre dimensions, and in particular to fabrication of such materials in a nitride material system. Such materials can be used in a wide range of applications including phosphor-converted LEDs, emissive EL displays, solar cells and bio-imaging.

BACKGROUND ART

Semiconductor nanocrystals whose dimensions are comparable to the bulk exciton diameter show quantum confinement effects. This is seen most clearly in the optical spectra which shift to blue wavelengths as the size of the crystal is reduced.

Semiconductor nanocrystals made from a wide range of materials have been studied including many II-VI and III-V semiconductors. In addition to spherical nanocrystals, rod-, arrow-, teardrop- and tetrapod-shaped nanocrystals [Alivisatos et. al., J. Am. Chem. Soc, 2000, 122, 12700; WO03054953] and core-shell structures [Bawendi, J. Phys. Chem. B, 1997, 101, 9463; Li and Reiss, J. Am. Chem. Soc., 2008, 130, 11588] have also been prepared. To control the size and shape of such nanocrystals their synthesis is generally performed in the presence of one or more capping agents (sometime called surfactants or coordinating solvents). Such capping agents control the growth of the nanocrystals and also increase the strength of the light emission though the passivation of surface states. A wide range of capping agents have been employed including phosphines [Bawendi et. al., J. Am. Chem. Soc., 1993, 115, 8706], phosphine oxides [Peng et. al., J. Am. Chem. Soc., 2002, 124, 2049], amines [Peng et. al., J. Am. Chem. Soc., 2002, 124, 2049], fatty acids [Battaglia and Peng, Nano Lett., 2002, 2, 1027; Peng et. al., J. Am. Chem. Soc., 2002, 124, 2049], thiols [Li and Reiss, J. Am. Chem. Soc., 2008, 130, 11588] and more exotic capping agents such a metal fatty acid complexes [Nann et. al., J. Mater. Chem., 2008, 18, 2653].

Methods to prepare semiconductor nanocrystals include solvothermal reactions [Gillan et. al., J. Mater. Chem., 2006, 38, 3774], hot injection methods [Battaglia and Peng, Nano Lett., 2002, 2, 1027], simple heating processes [Van Patten et. al., Chem. Mater., 2006, 18, 3915], continuous flow reactions [US2006087048] and microwave assisted synthesis [Strouse et. al., J. Am. Chem. Soc., 2005, 127, 15791]

One of the most interesting classes of semiconductors is the III-nitrides, such as AlN, GaN, InN and their respective alloys. These are used for the manufacture of blue light-emitting diodes, laser diodes and power electronic devices. Nitrides are also chemically inert, are resistant to radiation, and have large breakdown fields, high thermal conductivities and large high-field electron drift mobilities, making them ideal for high-power applications in caustic environments [Neumayer at. al., Chem., Mater., 1996, 8, 25]. The band gaps of aluminium nitride (6.2 eV), gallium nitride (3.5 eV) and Indium nitride (0.7 eV) [Gillan et. al., J. Mater. Chem., 2006, 38, 3774] mean that nitrides span much of the ultraviolet, visible and infrared regions of the electromagnetic spectrum. The fact that alloys of these materials have direct optical band gaps over this range makes these very significant for optical devices. In the case of nanocrystals based on III-nitride semiconductors, tuning the band gap through alloying and quantum confinement effects opens up the possibility of making unique nanocrystalline phosphors spanning a wide region of the electromagnetic spectrum. However, to date, routes to fabricate nitride nanocrystals have resulted in only weakly emissive materials and have had poor control over the size of the nanocrystals produced.

Nanocrystalline indium nitride and indium gallium nitride have been prepared from the solvothermal reaction of metal halides with sodium azide [Gillan et. al., J. Mater. Chem., 2006, 38, 3774]. No emission spectra of the material were presented although some images from a fluorescence microscope were included. Nanocrystalline indium nitride has also been prepared from the solvothermal reaction of indium iodide with sodium amide [Xie et. al., New. J. Chem., 2005, 29, 1610]. In this work indium nitride nanocrystals were prepared and emission spectra are reported but no indication as to the intensity of the emission, such as a photoluminescent quantum yield, is reported. Other workers have attempted to prepare nitride nanocrystals in the presence of capping agents, but strong emission of light has never been reported in nitride nanocrystals prepared in these ways. [Mićić et. al., Appl. Phys. Lett., 1999, 74, 478; Van Patten et. al., Chem. Mater., 2006, 18, 3915; Cole-Hamilton et. al., J. Mater. Chem., 2004, 14, 3124; Rao et. al., Small, 2005, 1, 91].

WO 2006/027778 discloses core-shell nanocrystal structures, and proposes that the nanocrystals may be capped using an "outer organic ligand layer" or "organic capping agent" having an electron-donating functional group.

WO 2005/110916 teaches providing a metallic layer around a semiconductor nanocrystal core. As an example, zinc stearate may be used as a zinc precursor to obtain a metallic zinc layer around a semiconductor nanocrystal core.

WO 2005/001906 relates to a method for using emissive semiconductor nanocrystals to image a lymphatic system. It proposes coating the nanocrystals using a phosphine ligand to improve their solubility.

US 2006/0240227 relates to the production of core-shell nanocrystal structures. It proposes use of capping agents to promote solubility of the obtained nanocrystals. In one example it proposes use of TOPO (trioctylphosphoine oxide) or ODA (octadecylamine) as a capping agent in the preparation of a CdSe/ZnS structure.

SUMMARY OF INVENTION

A first aspect of the present invention provides a method of manufacturing at least part of a light-emissive nitride nanoparticle, the method comprising manufacturing the nitride nanoparticle from one or more constituents comprising: a first material containing metal, boron or silicon, a second material containing nitrogen, and a capping agent having an electron-accepting group for increasing the quantum yield of the nitride nanoparticle. (It should be noted that the first material and the second material need not be separate constituents, and a single constituent may act as both the first material and the second material. Moreover, the capping agent need not be a separate constituent but may be combined with the first material or the second material (or with a material, that acts as both the first material and the second material)—an example could be an indium thiolate where the thiolate is part of the first (metal-containing) material but also functions as a capping agent.) It has been found that providing a capping agent having an electron-accepting group significantly increases the photoluminescent quantum yield of the resultant nitride nanoparticle—prior art nitride nanoparticles have a photoluminescent quantum yield of well below 1%, whereas nitride nanoparticles manufactured by a method of the present invention can have a photoluminescent quantum yield of 20% or greater.

The "photoluminescent quantum yield" of a nitride nanoparticle is the ratio, when the nanoparticle is illuminated by an exciting light source to cause the nanoparticle to photoluminesce, of the number of photons emitted by the nanoparticle to the number of photons absorbed by the nanoparticle.

It should be noted that the term "photoluminescence quantum yield" should not be confused with the term "photoluminescence quantum efficiency" which is sometimes used in the art. The "photoluminescence quantum efficiency" takes into account the energy of the photons which are absorbed and emitted by a material. In cases where the excitation and emission wavelengths are similar the photoluminescence quantum yield and photoluminescence quantum efficiency will have similar values; however in cases where the excitation wavelength is shorter and hence of higher energy than the emission wavelength the photoluminescence quantum efficiency will be lower than the photoluminescence quantum yield.

The electron-accepting group may include a metal, silicon or boron. Such an electron-accepting group has been found to be effective in the manufacture of a nitride nanoparticle with a high quantum yield.

A second aspect of the present invention provides a method of manufacturing at least part of a nitride nanoparticle, the method comprising manufacturing the nitride nanoparticle from one or more constituents including: a first material containing metal, boron or silicon, a second material containing nitrogen, and a capping agent having an electron-accepting group, the electron-accepting group containing a metal, boron or silicon.

The first material and the second material may contain the same metal (or may both contain boron or silicon), or they may not contain the same metal (or boron or silicon) as one another.

The methods of the first and second aspects may be used to manufacture the entire nanoparticle. Alternatively, they may be used to manufacture only part of the nanoparticle—for example, the methods of the invention may be used to manufacture the core of a core-shell structure (with the shell being fabricated by another method), or they may be used to manufacture the shell of a core-shell structure (with the core being fabricated by another method).

The electron-accepting group may include a Group II metal or a Group III metal. (As used herein, the term "Group III" metal denotes Al, Ga, In or Tl, whereas the term "Group III" element denotes B, Al, Ga, In or Tl.) Alternatively, it may include a metal selected from the group consisting of: Sc, Ti, V, Cr, Mn, Fe, Co, Ni, Cu, Zn, Zr, Ag, Mo, Ru, Pd, Cd, Ta, W, Os, Ir, Pt, Au and Hg. The metal may for example be provided as a metal amine, a metal carboxylate, a metal acetoacetonate, a metal sulfonate, a metal phosphonate, a metal thiocarbamate, or a metal thiolate. Alternatively, it may include a metal selected from the group consisting of: In, Ga and Al.

The constituent(s) may further include a capping agent having an electron-donating group. This may help to promote solubility of one or more constituents in the reaction mixture thereby to provide a more homogeneous solution which should allow for more controlled growth of the nanocrystals. The capping agent having an electron-donating group may be the same as the capping agent having the electron-accepting group, or alternatively two (or more) different capping agents may be used.

The electron-donating group may be selected from the group consisting of: phosphines, phosphine oxides, carboxylic acids, carboxylates, amines, sulfonates, esters, thiols and thiolates.

The constituent(s) may include material(s) containing two or more metals (or boron or silicon). This allows formation of nanoparticles of alloys of two or more nitrides, with the general formulae $M1_{x1}M2_{x2}M3_{x3}\ldots Mn_{xn}N_y$ where M1, M2, M3 . . . Mn are different metals, boron or silicon. The two or more metals, boron or silicon may be provided by separate constituents from one another, or alternatively a single constituent may include two or more different metals, boron or silicon.

The method may comprise manufacturing the at least part of the nitride nanoparticle from the one or more constituents by reacting the constituent(s) in a first solvent.

The second material (that is, the material that acts as the source/precursor of nitrogen) may be soluble in the first solvent. It has been found that using nitrogen sources that are soluble or substantially soluble leads to emission peaks in the final nanostructure that have a lower full width at half maximum intensity than when an insoluble nitrogen source/precursor is used. One suitable soluble nitrogen source is lithium diethyl amide.

The first solvent may have a high boiling point, for example a boiling point of at least 200° C. As described above, many prior art methods use a "solvothermal" process, which involves the decomposition of reaction constituents in a solvent at a temperature higher than the boiling point (at atmospheric pressure) of the solvent—and so requires that the reaction is carried out in a closed system that can be pressurised above atmospheric pressure. Use of a solvent having a high boiling point (at atmospheric pressure) avoids the need to carry out the process in a closed vessel. The desired reaction temperature is likely to be in the range 150° C.-300° C., and possibly in the range 210° C.-250° C., so that a solvent with a boiling point of at least 200° C., or even 250° C. or above, would be required to allow the reaction to be carried out without needing to carry out the process in a closed vessel. In principle any solvent with a boiling point higher than the desired reaction temperature may be used without the need to carry out the process in a closed vessel—although if the reaction temperature is close to the boiling point of the solvent a condenser may be required to condense the vapour from the reaction vessel and return it to the reaction vessel.

The reaction may be effected in any suitable way. For example, it may be effected by providing all constituents in the solvent, heating the mixture to the desired reaction temperature, and maintaining the mixture at the desired reaction temperature. Alternatively, it may be effected by disposing some but not all constituents in the solvent, heating the mixture to the desired reaction temperature, introducing the remaining constituents into the heated mixture, and maintaining the final mixture at the desired reaction temperature; where this method is used, the remaining constituents may themselves be heated (for example in solvent) before being introduced into the heated mixture.

The at least one capping agent may further include a group for promoting solubility of the nitride nanoparticle in a second solvent. This may make subsequent processing of the nanoparticle easier. The group for promoting solubility of the nanostructure may be an alkyl chain (straight or branched).

The second solvent may be a polar solvent, for example methanol, ethanol, or water. Alternatively, the second solvent may be a non-polar solvent, for example toluene, hexane, or an ether.

The group for promoting solubility of the nitride nanoparticle may be an alkyl chain.

The second material may be a metal amide. This is a convenient nitrogen source for use in the methods of the invention.

The nitride nanoparticle may be a Group III nitride nanoparticle. It may be an Indium nitride nanoparticle. Indium nitride has a bandgap in the infra-red part of the spectrum so that, with confinement effects, indium nitride nanoparticles have bandgaps in the visible region of the spectrum.

The first material may be Indium iodide, the second material may be $NaNH_2$, $LiNH_2$ or $KNH_2$, and the capping agent having an electron-accepting group may be a zinc carboxylate.

The method may comprise manufacturing the nitride nanoparticle from the one or more constituents by reacting the first material, the second material and the capping agent at a temperature between 150° C. and 300° C. It has been found that reaction temperatures below 150° C. lead to low crystal quality of the obtained nanoparticle, whereas temperatures above 300° C. lead to a low value of the PLQY of the obtained nanoparticle. The reaction temperature may be between 210° C. and 250° C.

The method may comprise controlling the length of the period for which the first material, the second material and the capping agent are reacted, thereby to obtain a nanoparticle having a desired dimension. The longer the reaction continues the larger are the dimensions of the obtained nanoparticles, and optical and other properties of the nanoparticles are dependent on the dimensions of the nanoparticles. Thus, the size and corresponding emission properties (and other properties) of the nanoparticles may be simply controlled by the length of the reaction.

A third aspect of the invention provides method of forming a core-shell nanoparticle, the method comprising forming a nitride crystal according to a method of the first or second aspect, the nitride crystal forming a core of the nanoparticle; and further comprising forming a shell around the core.

A fourth aspect of the invention provides method of forming a core-shell nanoparticle, the method comprising forming a shell around a core of the nanoparticle, the shell being formed by a method of the first or second aspect.

A fifth aspect of the present invention provides a light-emissive nitride nanoparticle manufactured by a method of the first or second aspect.

A sixth aspect of the present invention provides a core-shell nanoparticle manufactured by a method of the third or fourth aspect.

The shell may be a ZnS shell. Preferred materials for forming the shell are materials with similar lattice parameters to the core since, if there is a good match between the lattice parameters of the core and the lattice parameters of the shell, the amount of defects in the crystal can be minimised. Moreover, to maximise the PLQY it is advisable to use a shell material with larger band gap than the material used for the core, so the excited states are contained within the core of the nanocrystal and hence are protected from the surface and the environment of the nanocrystals. ZnS meets these requirements, and methods used to synthesise ZnS are well known. However the shell is not limited to ZnS and other suitable materials may be used.

The light-emissive nitride nanoparticle may have a photoluminescence quantum yield of at least 1%, or of at least 5%, or of at least 10%, or of at least 20%.

The present invention provides a method of fabricating highly light-emissive nitride nanoparticles, for example nanocrystals. Nitride nanocrystals obtained using prior art fabrication methods are not highly emissive.

The method of fabricating nitride nanoparticles, for example nanocrystals, according to the invention preferably involves performing the synthesis of a metal nitride in the presence of one or more capping agents which are able to coordinate effectively to the surface of the growing crystal. For the first time highly emissive nitride nanoparticles, for example nanocrystals, have been prepared with good control over their size.

In order to achieve this, it was first found that the reaction of indium iodide with sodium amide successfully led to the formation of nanocrystalline indium nitride when the mixture was heated to 200° C. or above (for example to 225° C.) in a high boiling point solvent as opposed to the high pressure solvothermal route which is described in the prior art. Secondly, it was identified that the addition of an electron-donating group, for example an alkyl thiol (such as 1-hexadecane thiol), led to the formation of soluble indium nitride nanocrystals which were however, not highly emissive. Finally, the addition of an electron-accepting group, for example zinc stearate, to the reaction led to the formation of highly emissive indium nitride nanocrystals whose size and corresponding electronic spectra may be simply controlled by the length of the reaction, which may be varied between 5 and 60 minutes to provide peak emission wavelengths covering substantially the entire visible spectrum. In addition it was realised that an electron-accepting group, for example zinc stearate, helps to solubilise the sodium amide in the reaction mixture to provide a more homogeneous solution which is expected to allow for more controlled growth of the nanocrystals.

It is believed that the zinc atom in the zinc stearate is able to coordinate to the nitrogen atoms on the surface of the nanoparticle/nanocrystal which allows controlled growth of the nanoparticles/nanocrystals and also passivates the surface and provides strong emission. This provides a significant advantage over the prior art.

It is important to understand that, in embodiments of the present invention in which zinc stearate is used in manufacture of a nanoparticle, for example a nanocrystal, the zinc stearate is used as a capping agent having an electron-accepting functional group. The electron accepting functional group is able to coordinate to the surface of the nanoparticle, and this is believed to occur by the individual metal (or silicon or boron) atoms of the electron accepting functional group coordinating to nitrogen atoms on the surface of the nanoparticle such that the nitrogen atoms are passivated and do not quench the fluorescence of the nanoparticle. It is important to note that, although the electron accepting functional group may contain metal atoms, the individual metal atoms form constituents in a metal complex and do not bond together to form a bulk metal having free electrons available for conduction. In contrast, in the method proposed in WO 2005/110916, zinc stearate may be used as a zinc precursor to obtain a bulk metallic zinc layer around a semiconductor nanocrystal core.

The invention may also be used in the manufacture of non-emissive nitride nanoparticles.

Compared to other semiconductors the nitrides span a wider range of the electromagnetic spectrum and like other III-V materials they have large exciton diameters suggesting they should have more pronounced quantum size effects on the optical spectra [Brus, J. Chem. Phys., 1983, 33, 6976]. This property is seen in the emission spectra of indium nitride nanocrystals prepared according to a method of the current invention shown in FIG. 2 which shows that the peak emission wavelength may be tuned to have a value in the range at least from 480 nm to 850 nm—which is a larger range than nanocrystals made from any other material known in the prior art.

At the present time the majority of emissive nanocrystals are composed of II-VI materials such as cadmium sulphide, cadmium selenide and lead sulphide. The presence of highly toxic heavy metals in these materials also gives the nitride nanocrystals of the present invention a significant advantage over the prior art. Ever-tightening regulations and consumer awareness make using toxic materials in consumer products increasingly difficult. Another advantage is the low cost of all the starting materials used to prepare the nitride nanocrystals described here and the simple one step process used to prepare the nanocrystals from these materials.

BRIEF DESCRIPTION OF DRAWINGS

FIG. 9($b$) is a Fourier transform of the HRTEM image of FIG. 9($a$);

FIG. 11($b$) is a size histogram of InN—ZnS core-shell nanoparticles;

FIG. 12($b$) is a Fourier transform of the HRTEM image of FIG. 12($a$);

FIG. 13($b$) is a Fourier transform of the HRTEM image of FIG. 13($a$);

DESCRIPTION OF EMBODIMENTS

Figure 1:
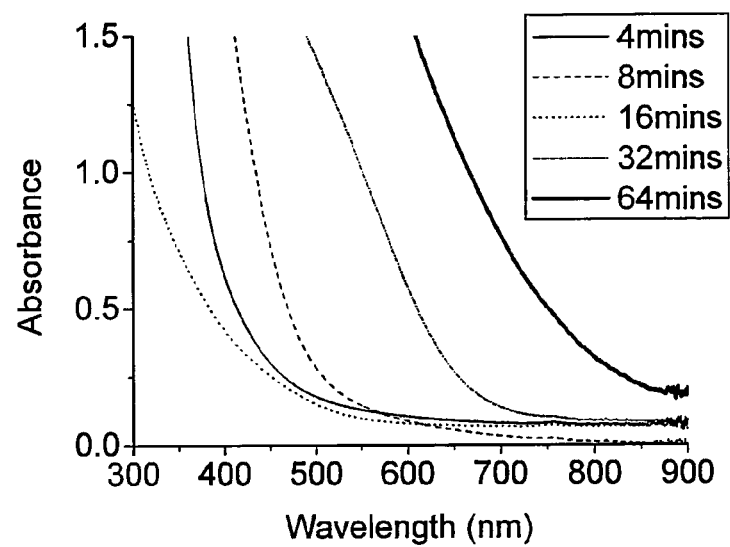
FIG. 1 shows absorption spectra of a set of indium nitride nanocrystal solutions obtained from a single reaction at different times.

This invention relates to fabrication of nanoparticles, for example nanocrystals, of semiconducting compounds. More specifically it relates to fabrication of emissive nanoparticles, for example nanocrystals, of nitrides of the general formulae $M_xN_y$ where M is a metal, silicon or boron and x and y are integers which are required to balance the stoichiometry. The invention also relates to fabrication of emissive nanoparticles, for example nanocrystals, of alloys of two or more nitrides, with the general formulae $M1_{x1}M2_{x2}M3_{x3}\ldots Mn_{xn}N_y$ where M1, M2, M3 . . . Mn correspond to different metals, boron or silicon, the numbers x1, x2, x3 . . . xn give the relative quantities of the metals in the alloy and y is the quantity of nitrogen required to balance the stoichiometry. The invention will be described below with reference to fabrication of nitrides of the general formula $M_xN_y$, but the principles apply equally to fabrication of nitrides of the general formula $M1_{x1}M2_{x2}M3_{x3}\ldots Mn_{xn}N_y$.

More specifically the invention relates to fabrication of emissive nanoparticles, for example nanocrystals, of nitrides of the group III elements and their alloys, with the general formula $B_{x1}Al_{x2}Ga_{x3}In_{x4}Tl_{x5}N$, where the numbers x1, x2, x3, x4 and x5 range from 0 to 1 and give the relative quantities of the metals in the alloy and x1+x2+x3+x4+x5=1 (ie, y=1). More specifically this invention relates to fabrication of emissive InN nanoparticles, for example nanocrystals.

The present invention makes possible the fabrication of nanoparticles, for example nanocrystals, having a uniform size. The nanoparticles, for example nanocrystals, may be fabricated such that their diameters range from about 1 nm to about 100 nm and more specifically from about 1 nm to about 30 nm. (As noted above, optical and other properties of nanostructures are determined by their size.) The invention may be used to fabricate nanocrystals of a range of shapes such as roughly wire-, platelet-, spherical, rod-, arrow-, teardrop- and tetrapod-shapes.

In addition nanoparticles (eg nanocrystals) provided by this invention may have a "core-shell" structure where a shell of a second material is grown directly onto the surface of the nitride nanoparticle. More than one such shell may be grown. This shell may be made from a different metal nitride to that used for the core or an alternative III-V or II-VI semiconductor or any other suitable material. Ideally the band gap of the shell material will be larger that that of the metal nitride which forms the core to help confine the excited state within the core of the nanocrystals; this is known to improve the intensity of the emission from such materials.

The method disclosed in this invention requires a source of metal, boron or silicon to form the metal nitride nanoparticle. Any compound containing metal, boron or silicon may be considered. Specific examples which may be preferred include the following; metal, boron or silicon fluorides, chlorides, bromides, iodides, acetates, carboxylates, alkoxides, hydroxides, trifluormethanesulfonates, oxides, sulphides, sulphates, sulphites, carbonates, nitrates, nitrites, azides, amides, alkyls, phosphonates and phosphides. One or more sources of metal, boron or silicon may be used to produce nanoparticle, for example nanocrystals, consisting of a nitride alloy such as InGaN. In a preferred embodiment the source is an iodide such as $InI_3$, $GaI_3$ etc.

The method disclosed in this invention requires a source of nitrogen to form the nitride nanoparticles, eg nitride nanocrystals. Any suitable nitrogen containing compound may be considered. Specific examples which may be preferred include ammonia, metal azides, metal nitrides, amines (such as $N(SiR_3)_3$, $NH(SiR_3)_2$, $NH_2(SiR_3)$, $NR_3$, $NHR_2$, $NH_2R$ where R is an alkyl group such as —$(CH_2)_nCH_3$ where n is an integer, any branched alkyl group such as —$C(CH_3)_3$ or —$CO_2C(CH_3)_3$), metal amides (such as $M_x(N(SiR_3)_2)_y$ and $M_x(NR_2)_y$ where R is H or an alkyl group such as —$(CH_2)_nCH_3$ where n is any integer or any branched alkyl group such as —C(CH$_3$)$_3$ or —CO$_2$C(CH$_3$)$_3$, M is a metal preferably a group 1 or group 2 metal such as Li, Na, K, Ca and Mg, x and y are integers required to balance the stoichiometry). In the preferred embodiment the source of nitrogen is NaNH$_2$, LiNH$_2$ or KNH$_2$.

In addition to using separate materials to provide the metal (or boron or silicon) and nitrogen required to form the nitride nanoparticles, for example nanocrystals, it is also within the scope of the present invention to use a single material to provide both the metal (or boron or silicon) and nitrogen required to from the nitride nanoparticles. Any suitable material can be used, specific examples include compounds such as M(NR$_2$)$_x$ (where M is the metal, boron or silicon to be included, x is a number required to balance the stoichiometry in the nitride and R is H, an alkyl group such as —(CH$_2$)$_n$CH$_3$ where n is an integer, any branched alkyl group such as —C(CH$_3$)$_3$ or —CO$_2$C(CH$_3$)$_3$), M(N(SiR$_3$)$_x$ (where M is the metal, boron or silicon to be included in the nitride x is a number required to balance the stoichiometry and R is an alkyl group such as —(CH$_2$)$_n$CH$_3$ where n is an integer, any branched alkyl group such as —C(CH$_3$)$_3$ or —CO$_2$C(CH$_3$)$_3$), metal amide polymers, metal azide complexes and metal urea complexes.

A further feature of the fabrication methods of the current invention is the choice of capping agents which are used in order to control the growth of the nanoparticles, for example nanocrystals, and passivate the surface of the nanoparticles to enable strong emission. These capping agents generally consist of a functional group which is able to coordinate to the surface of the metal nitride nanoparticle by means of either an electron donating or electron accepting functional group. The capping agents may also optionally contain a long straight or branched alkyl chain to solubilise the nanoparticle in non polar solvents such as toluene, hexane and diethyl ether. The alkyl chain may optionally also be modified or functionalised in such a way to enable the nanoparticle to dissolve in polar solvents such as methanol, ethanol and water. This may for example be achieved by appending polar functional groups to the alkyl chain such as —P(O)(OM)$_2$, —OP(O)(OM)$_2$, —C(NH)OM, —CO$_2$M, —SO$_3$M, —OSO$_3$M and —NH$_4$X where M is a metal and X is a counter ion. An alternative strategy to enable the nanoparticle to dissolve in polar solvents is to use an alkyl chain containing a multitude of ether linkages (—CH$_2$—O—CH$_2$—). In addition to providing solubility in both polar and non-polar solvents the alkyl chain attached to the nanocrystal can also be modified to allow attachment of the nanocrystal to other species or materials which may be desirable for some applications. Derivatives containing specific binding sites for other species are also part of the current invention and may be useful in areas such as bio imaging, pollution monitoring and such like.

In a further embodiment the alkyl chain may be chosen such that the nanoparticle, for example nanocrystal, can be integrated into a solid matrix such as a polymer, plastic, glass etc. In a further embodiment the alkyl chain may be chosen such that the nanoparticle can be modified in such a way that it can be polymerised. In a preferred embodiment a simple straight alkyl chain is used, with the chain having between 5 and 30 CH$_2$ units and more ideally 10-20 CH$_2$ units.

Any electron donating functional groups may be suitable but functional groups such as phosphines, phosphine oxides, carboxylic acids, carboxylates, amines, sulfonates, esters, thiols and thiolates are preferred. In a preferred embodiment thiolates are chosen as the electron donating functional group.

For the electron accepting group a suitable metal, boron or silicon may be used. It may be preferred to use any group II or group III metal or one of the following metals (Sc, Ti, V, Cr, Mn, Fe, Co, Ni, Cu, Zn, Zr, Ag, Mo, Ru, Pd, Ag, Cd, Ta, W, Os, Ir, Pt, Au, Hg). In a preferred embodiment Zn is used. To connect the metal (or boron or silicon) to the alky chain any moiety can be used such as amines, carboxylates, acetoacetonates, sulfonates, phosphonates, thiocarbamates, thiolates. In the preferred embodiment a zinc carboxylate such as zinc stearate is used.

In one embodiment a single capping agent is used to provide both an electron donating and electron accepting group. In another embodiment more than two different capping agents are used. In the preferred embodiment one capping agent is used as an electron donor and one is used as a electron acceptor.

One application of nanoparticles, for example nanocrystals, that may be obtained by the current invention is the use of metal (or boron or silicon) nitride nanoparticles as phosphors in a range of lighting applications where a separate light source is used to excite the nitride nanocrystal phosphor. In one embodiment nitride nanocrystal phosphors emitting in a narrow spectral range can be used to make a light that emits pure saturated colour in any region of the spectrum. In a further embodiment mixing a range of different sized nitride nanocrystals will enable light of any colour (or of any colour range) to be generated by this invention. A preferred embodiment is when the light source used to illuminate the nanocrystals is a light emitting diode such that a phosphor-converted light emitting diode is produced. Nanoparticles obtained by a method of the invention may be disposed over the body of an LED, or possibly incorporated within the LED body; in use, the nanoparticles would absorb light from the LED and re-emit it so that the output would consist either of a mixture of the LED output light and light re-emitted by the nanoparticles or (if the nanoparticles absorbed substantially all the LED output light) solely of light re-emitted by the nanoparticles.

A further application of nanoparticles, for example nanocrystals, that may be obtained by the current invention is to use the nitride nanocrystal described to prepare a core-shell nanocrystal where one or more shells of different materials to the nanocrystal are grown on the surface on the nanocrystal (which forms the core of the core-shell structure. Surface coating of nanoparticles with one or more different materials to produce "core-shell" structures is currently an active area of research, because such "core-shell" structures allow modification and tailoring of physical and chemical properties of the core materials with the degree of modification depending on the shell material(s). Furthermore, core-shell structures are expected to have properties that are not present in either the core or shell materials. More than one shell may be grown over the core.

A further application of nanoparticles, for example nanocrystals, that may be obtained by the current invention is the use of metal (or boron or silicon) nitride nanoparticles/nanocrystals to provide large area illumination panels which are excited by a light source such as a light emitting diode or laser diode.

A further application of nanoparticles, for example nanocrystals, that may be obtained by the current invention is the use of metal nitride nanoparticles/nanocrystals to provide fluorescent fibres, rods, wires and other shapes.

A further application of nanoparticles, for example nanocrystals, that may be obtained by this invention is the use of an electrical current to generate the excited state which decays with the emission of light to make a light emitting diode with direct electrical injection into the nitride nanoparticle/nanocrystal.

A further application of nanoparticles, for example nanocrystals, that may be obtained by the current invention is the use of metal (or boron or silicon) nitride nanoparticles/nanocrystals as part of the back light used in a liquid crystal display.

A further application of nanoparticles, for example nanocrystals, that may be obtained by this invention is the use of metal (or boron or silicon) nitride nanoparticles/nanocrystals as the emissive species in a display such as a plasma display panel, a field emission display or a cathode ray tube.

A further application of nanoparticles, for example nanocrystals, that may be obtained by this invention is the use of metal (or boron or silicon) nitride nanoparticles/nanocrystals as the emissive species in an organic light emitting diode.

A further application of nanoparticles, for example nanocrystals, that may be obtained by this invention is the use of metal (or boron or silicon) nitride nanoparticles/nanocrystals as the emissive species in a solar concentrator, where the light emitted by the solar concentrator is matched to a solar cell used to convert the collected light to an electrical current. More than one such concentrator may be stacked on one another to provide light at a series of wavelengths each matched to a separate solar cell.

A further application of nanoparticles, for example nanocrystals, that may be obtained by the current invention is the use of metal (or boron or silicon) nitride nanoparticles/nanocrystals as the light harvesting species in an organic solar cell or photo detector.

A further application of nanoparticles, for example nanocrystals, that may be obtained by the current invention is the use of metal (or boron or silicon) nitride nanoparticles/nanocrystals as the light harvesting species in a dye sensitised solar cell or photo detector.

A further application of nanoparticles, for example nanocrystals, that may be obtained by the current invention is the use of metal (or boron or silicon) nitride nanoparticles/nanocrystals to generate multiple excitons from the absorption of a single photon though the process of multiple exciton generation in a solar cell or photo detector.

A further application of nanoparticles, for example nanocrystals, that may be obtained by the current invention is the use of metal (or boron or silicon) nitride nanoparticles/nanocrystals to assist identification in combat.

A further application of nanoparticles, for example nanocrystals, that may be obtained by the current invention is the use of metal (or boron or silicon) nitride nanoparticles/nanocrystals to assist in asset tracking and marking.

A further application of nanoparticles, for example nanocrystals, that may be obtained by this invention is the use of metal (or boron or silicon) nitride nanoparticles/nanocrystals as counterfeit inks.

A further application of nanoparticles, for example nanocrystals that may be obtained by this invention is the use of metal (or boron or silicon) nitride nanoparticles/nanocrystals as bio markers both in-vivo and in-vitro.

A further application of nanoparticles, for example nanocrystals, that may be obtained by this invention is the use of metal (or boron or silicon) nitride nanoparticles/nanocrystals in photodynamic therapy.

A further application of nanoparticles, for example nanocrystals, that may be obtained by this invention is the use of metal (or boron or silicon) nitride nanoparticles/nanocrystals as bio markers in for example cancer diagnosis, flow cytometry and immunoassays.

A further application of nanoparticles, for example nanocrystals, that may be obtained by this invention is the use of metal (or boron or silicon) nitride nanoparticles/nanocrystals in flash memory.

A further application of nanoparticles, for example nanocrystals, that may be obtained by this invention is the use of metal (or boron or silicon) nitride nanoparticles/nanocrystals in quantum computing.

A further application of nanoparticles, for example nanocrystals, that may be obtained by this invention is the use of metal (or boron or silicon) nitride nanoparticles/nanocrystals in dynamic holography.

A further application of nanoparticles, for example nanocrystals, that may be obtained by this invention is the use of metal (or boron or silicon) nitride nanoparticles/nanocrystals in a thermoelectric device.

A further application of nanoparticles, for example nanocrystals, that may be obtained by this invention is the use of metal (or boron or silicon) nitride nanoparticles/nanocrystals in a device used in telecommunications.

A further application of nanoparticles, for example nanocrystals, that may be obtained by this invention is the use of metal (or boron or silicon) nitride nanoparticles/nanocrystals for any application.

EXAMPLES

In the following examples of methods according to the invention of fabricating a nanoparticle, for example a nanocrystal, diphenyl ether (b.p. 259° C. at atmospheric pressure, and provided as solvent) and 1-octadecene (b.p. 316° C. at atmospheric pressure, and provided as solvent) were (where used in an example) distilled under reduced pressure from calcium hydride. All other reagents were used as received (eg from Sigma-Aldrich) though all manipulations and the synthesis were carried out in a glove box using vacuum dried (140° C.) glassware and apparatus.

Example 1

Figure 2:
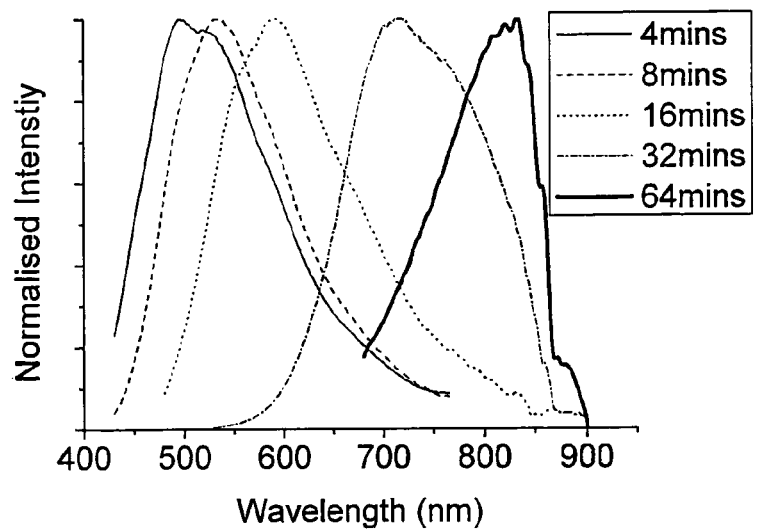
FIG. 2 shows emission spectra of a set of indium nitride nanocrystal solutions obtained from a single reaction at different times.

Indium iodide (300 mg, 0.6 mmol), sodium amide (500 mg, 12.8 mmol), hexadecane thiol (308 µl, 1.0 mmol), zinc sterate (379 mg, 0.6 mmol) and diphenyl ether (20 ml) (b.p. 259° C., and acting as solvent) were heated rapidly to 225° C. Of the constituents, Indium iodide provided a Group III metal (Indium), sodium amide provided nitrogen, hexadecane thiol is a capping agent with an electron-donating group, zinc stearate is a capping agent with an electron-accepting group and diphenyl ether acts as a solvent. Over the course of 60 minutes a number of 0.25 ml portions of the reaction mixture were removed and diluted with cyclohexane (3 ml) and any insoluble materials were removed using a centrifuge. The resulting clear solutions were analysed by absorption and emission spectroscopy and showed a change in the maximum emission wavelength from 480-850 nm over the course of the reaction, as shown in FIGS. 1 and 2. The peak in the emission spectrum has a full width at half the maximum intensity of the order of 150 nm.

To further purify the samples to remove any soluble impurities they were added drop wise to a 1:1 mixture of isopropanol and methanol (30 ml) to precipitate the nanocrystals which can be recovered using a centrifuge. The resulting solids can be redissolved in a second solvent, for example cyclohexane.

When samples from such a reaction are illuminated with a 354 nm light sources, the resultant emission is easily visible with the naked eye for samples emitting in the visible region. This illustrates the high quantum yield of nitride nanostructures obtainable by the present invention, as light-emission from prior art nitride nanostructures is usually of too low a level to be visible to the human eye.

Absorption spectra from a series of samples removed from the reaction at the times indicated on the legend are recorded in FIG. 1. This shows that the absorption spectrum changes with time, as a result of the size of the nanocrystals increasing as the reaction continues leading to a change in bandgap of the nanocrystals.

The corresponding emission spectra of these samples are shown in FIG. 2. The emission spectra of samples removed at times up to about one hour span substantially the whole visible region and extend into the infra-red. Thus, nanocrystals having particular optical properties (such as a desired peak emission wavelength) can be obtained by appropriate choice of the reaction period before the nanocrystals are recovered from the solution.

The photoluminescence quantum yield of a sample removed from this reaction was measured using an integrating sphere and gave a value of 10%. This is significantly greater than in the prior art, as prior art nitride nanostructures have photoluminescence quantum yields well below 1%.

This photoluminescence quantum yield (PLQY) measurement, and all PLQY measurements described herein, are carried out using the procedure described in Analytical Chemistry, Vol. 81, No. 15, 2009, pp 6285-6294. The measurements were carried out on dilute samples of the nitride nanocrystals in cyclohexane with absorbance between 0.04 and 0.1. Nile red in 1,4-dioxane was used as a standard; this has a PLQY 70% (Analytical Biochemistry, Vol. 167, 1987, 228-234). The excitation wavelength was fixed at 450 nm for all nanocrystal samples and for the reference.

Figure 3:
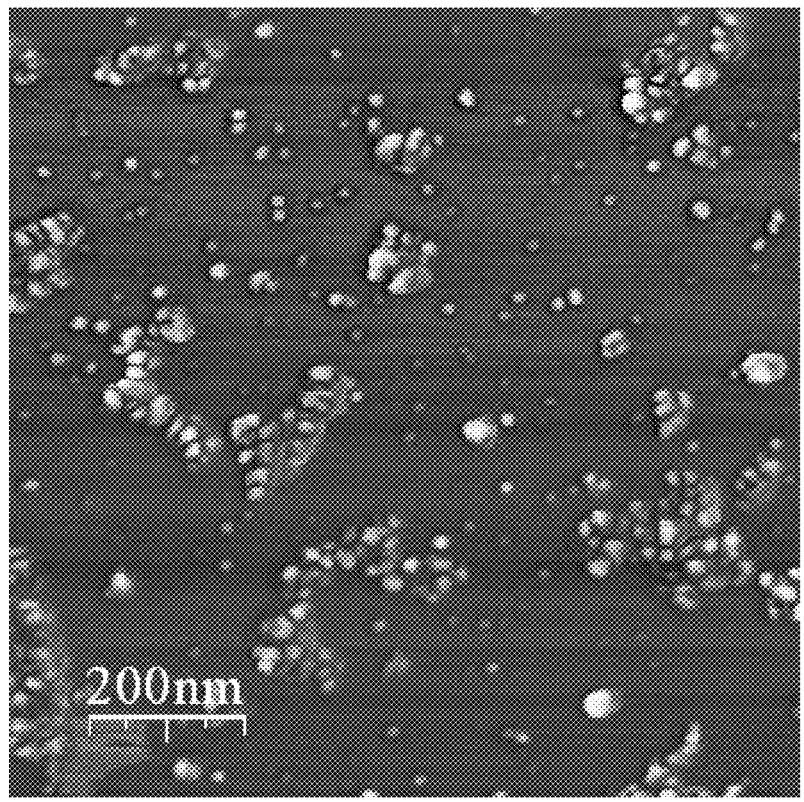
FIG. 3 shows an atomic force microscopy (AFM) phase image of indium nitride nanocrystals.
Figure 4:
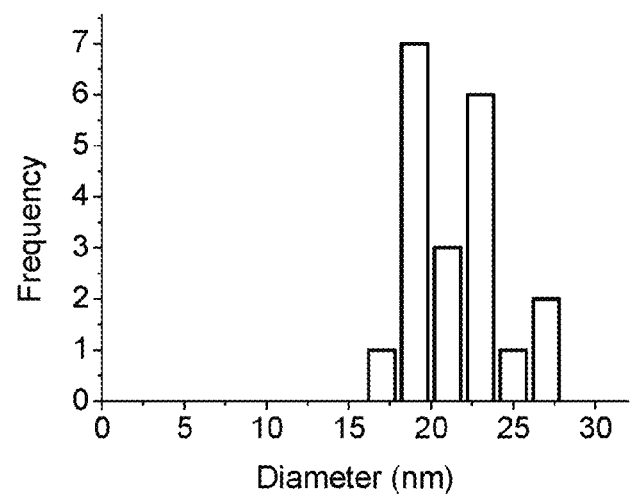
FIG. 4 shows a histogram showing the size distribution of a selection of the nanocrystals show in a FIG. 3.
Figure 5:
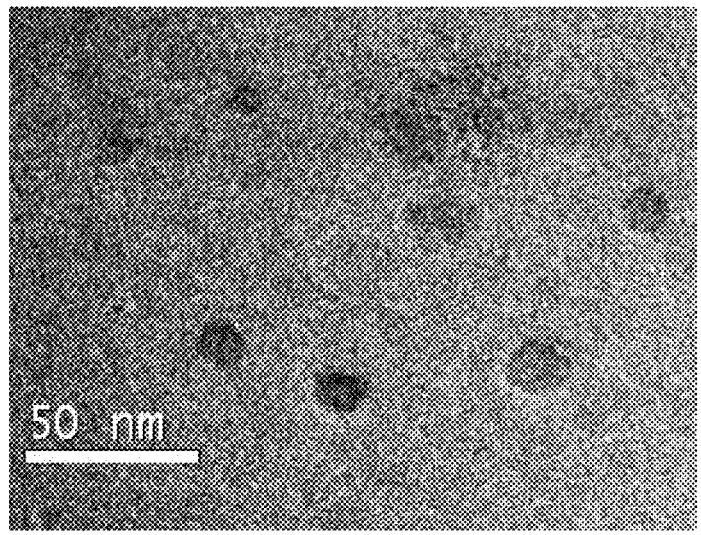
FIG. 5 shows an image from a transmission electron microscope showing a selection of indium nitride nanocrystals.
Figure 6:
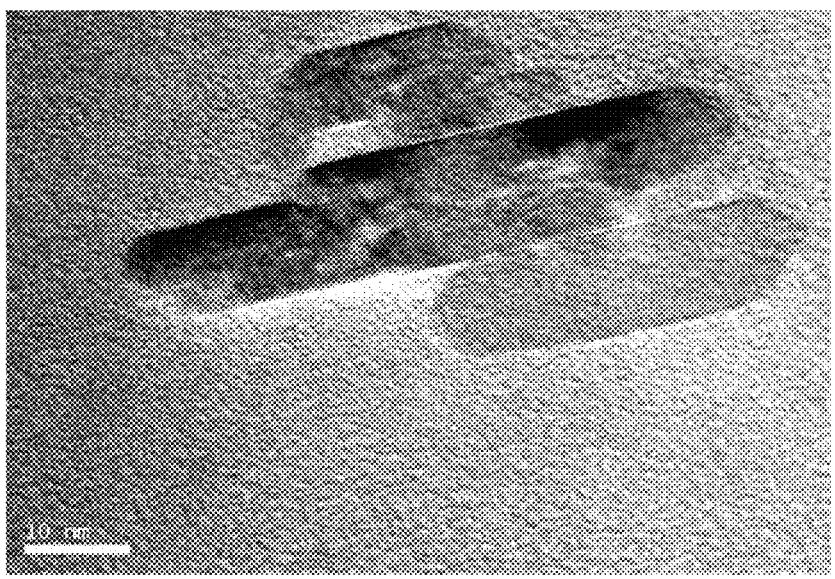
FIG. 6 shows an image from a transmission electron microscope showing a selection of elongated indium nitride nanocrystals.
Figure 7:
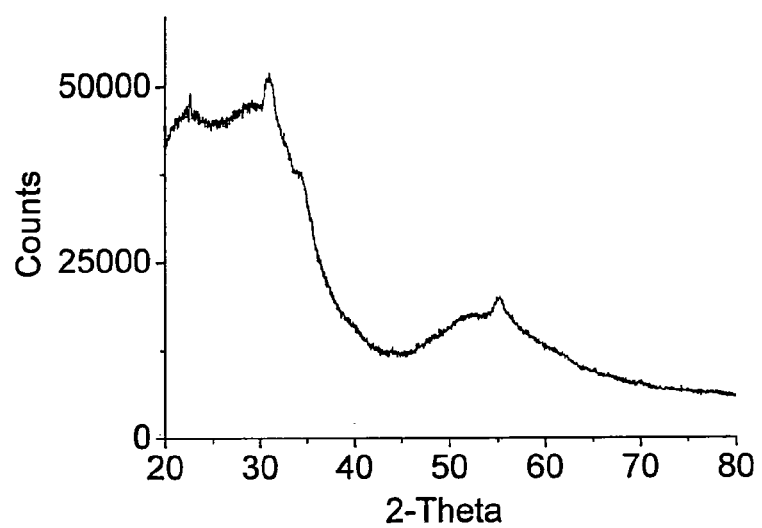
FIG. 7 shows a high resolution x-ray diffraction pattern image of indium nitride nanocrystals deposited on an amorphous silicon substrate.

A sample of InN nanocrystals in cyclohexane was spin coated on to a mica substrate and analysed by atomic force microscopy. FIG. 3 illustrates a phase image of the sample and the individual nanocrystals can clearly be observed. The histogram in FIG. 4 gives an indication of the size of the nanocrystals though the absolute size of the nanocrystals is likely to be smaller than the figures reported here (owing to the finite size of the tip of the atomic force microscope). FIG. 5 shows a TEM image of such a sample deposited onto a holey carbon film. FIG. 6 shows a TEM image of three nanorods found in one sample. FIG. 7 shows a high resolution x-ray diffraction pattern of a sample of indium nitride nanocrystals deposited on an amorphous silicon substrate. The pattern is broad due to the small size of the nanocrystals but follows the expected peak positions for hexagonal indium nitride.

Example 2

Indium iodide (300 mg, 0.6 mmol), sodium amide (500 mg, 12.8 mmol), hexadecane thiol (308 µl, 1.0 mmol), zinc stearate (379 mg, 0.6 mmol) and diphenyl ether (20 ml) were heated rapidly to 250° C. Over the course of 40 minutes 0.25 ml portions of the reaction mixture were removed and diluted with cyclohexane (3 ml) and any insoluble material was removed using a centrifuge. This gives clear solutions of emissive indium nitride nanocrystals. As in example 1, the absorption/emission properties of the obtained nanocrystals depend on the reaction, and show a similar dependence on time to FIGS. 1 and 2.

Example 3

Indium iodide (300 mg, 0.6 mmol), sodium amide (500 mg, 12.8 mmol), palmitic acid (256.4, 1.0 mmol), zinc stearate (379 mg, 0.6 mmol) and diphenyl ether (20 ml) were heated rapidly to 225° C. In this example, palmitic acid is used as a capping agent with an electron-donating group rather than hexadecane thiol.

Over the course of 40 minutes 0.25 ml portions of the reaction mixture were removed and diluted with cyclohexane (3 ml) and any insoluble material was removed using a centrifuge. This gives clear solutions of indium nitride nanocrystals. As in example 1, the absorption/emission properties of the obtained nanocrystals depend on the reaction, and show a similar dependence on time to FIGS. 1 and 2.

Example 4

A mixture of sodium amide (100 mg, 2.56 mmol), zinc stearate (76 mg, 0.12 mmol) and diphenyl ether (3 ml) was added rapidly to a solution of Indium iodide (60 mg, 0.12 mmol) and hexadecane thiol (62 µl, 0.2 mmol) in diphenyl ether (20 ml) heated at 250° C. Samples (0.5 ml) were removed at regular intervals between 6 and 20 minutes and diluted with toluene (3 ml). The emission spectra of the resulting samples show peaks with maxima ranging from 420 nm to 670 nm, depending on the time at which the samples were removed, with the full width at half the maximum ranging from 140-200 nm.

Example 5

A hot solution of Indium iodide ($InI_3$) (300 mg, 0.6 mmol) in diphenyl ether (3 ml) was added to a solution of sodium amide (500 mg, 12.8 mmol), hexadecane thiol (612 µl, 2.0 mmol), zinc stearate (760 mg, 1.2 mmol) and diphenyl ether (20 ml) heated at 225° C. Samples (0.5 ml) were removed at regular intervals between 1 and 15 minutes and diluted with hexane (3 ml). The emission spectra of the resulting samples show peaks with maxima ranging from 610 nm to 810 nm, depending on the time at which the samples were removed, with the full width at half the maximum ranging from 152-230 nm.

In examples 2-5, the nanocrystals may be recovered from the solution as described for example 1 above.

Example 6

Use of a soluble nitrogen source has been shown to reduce the full width at half the maximum intensity of the emission peaks, when compare to use of sodium amide as the nitrogen source. One suitable soluble nitrogen source is $(CH_3CH_2)_2NLi$—lithium diethyl amide. By the term "soluble" is meant that the nitrogen source is soluble in the reaction mixture, although this is generally equivalent to requiring that the nitrogen source is soluble in the solvent in which the reaction is performed since the solvent will make up the majority (by volume) of the reaction mixture. The nitrogen source does not need to be fully soluble but improved solubility is beneficial. Other suitable soluble nitrogen sources are other metal amides, such as lithium dimethylamide [$(CH_3)_2NLi$], lithium dipropylamide [$CH_3(CH_2)_3NLi$], lithium dibutyl amide [$CH_3(CH_2)_4NLi$] and other metal amides having the general formula $R_2NM$ where M is a metal and R is a straight or branched alkyl chain. It is believed that the reduction in width of the emission peaks is due to the increased solubility of the nitrogen source leading to a more homogeneous reaction mixture, which allows the growth of the individual nanocrystals to start at the same time as one another—hence during the course of the reaction the individual nanocrystals are more similar in size to one another which leads to narrower emission spectra in the resultant nanocrystals.

Indium iodide (300 mg, 0.6 mmol), lithium diethyl amide (1 g, 12.6 mmol), hexadecane thiol (308 µl, 1.0 mmol), zinc sterate (379 mg, 0.6 mmol) and 1-octadecene (20 ml) were heated rapidly to 225° C. The lithium diethyl amide constituted a soluble source of nitrogen. Over the course of 120 minutes a number of 0.25 ml portions of the reaction mixture were removed and diluted with cyclohexane (3 ml), and any insoluble materials were removed using a centrifuge. The resulting clear solutions were analysed by absorption and emission spectroscopy and this showed that the maximum emission wavelength changed from approximately 500 nm to approximately 600 nm over the course of the reaction. The peak in the emission spectrum has a full width at half the maximum intensity ranging from 110-150 nm which is smaller than observed when sodium amide is used as a nitrogen source.

Example 7

InN—ZnS Core-Shell Nanocrystals

Indium iodide (600 mg, 1.2 mmol), sodium amide (1 g, 15.6 mmol), hexadecane thiol (600 µl, 1.0 mmol), zinc stearate (760 mg, 1.2 mmol) and 1-octadecene (40 ml) were heated rapidly to 250° C. After maintaining the mixture at 250° C. for 30 minutes it was cooled to room temperature and any insoluble material was removed by centrifugation. The darkly coloured solution was decanted from the solids and further treated with zinc diethyl dithiocarbamate (1 g, 2.7 mmol) at 175° C. for 60 minutes. The mixture was cooled to room temperature and any insoluble material was removed by centrifugation to leave a solution of InN—ZnS core-shell nanocrystals. The zinc diethyl dithiocarbamate is a precursor for the ZnS of the shell. The nanocrystals were isolated by precipitation with 200 ml of anhydrous ethanol to leave a dark solid which readily dissolves in cyclohexane. The core-shell nanocrystals show an improved PLQY compared to corresponding core only nanocrystals.

The core-shell nanocrystals also show improved stability over time compared to the core only material. For core-only materials it has been found that exposure to air causes the emissive properties of the material to degrade and eventually disappear. By coating with zinc sulfide to form a core-shell structure, it is observed that the emissive properties are less sensitive to air and hence the nanocrystals are more stable over time.

Figure 8:
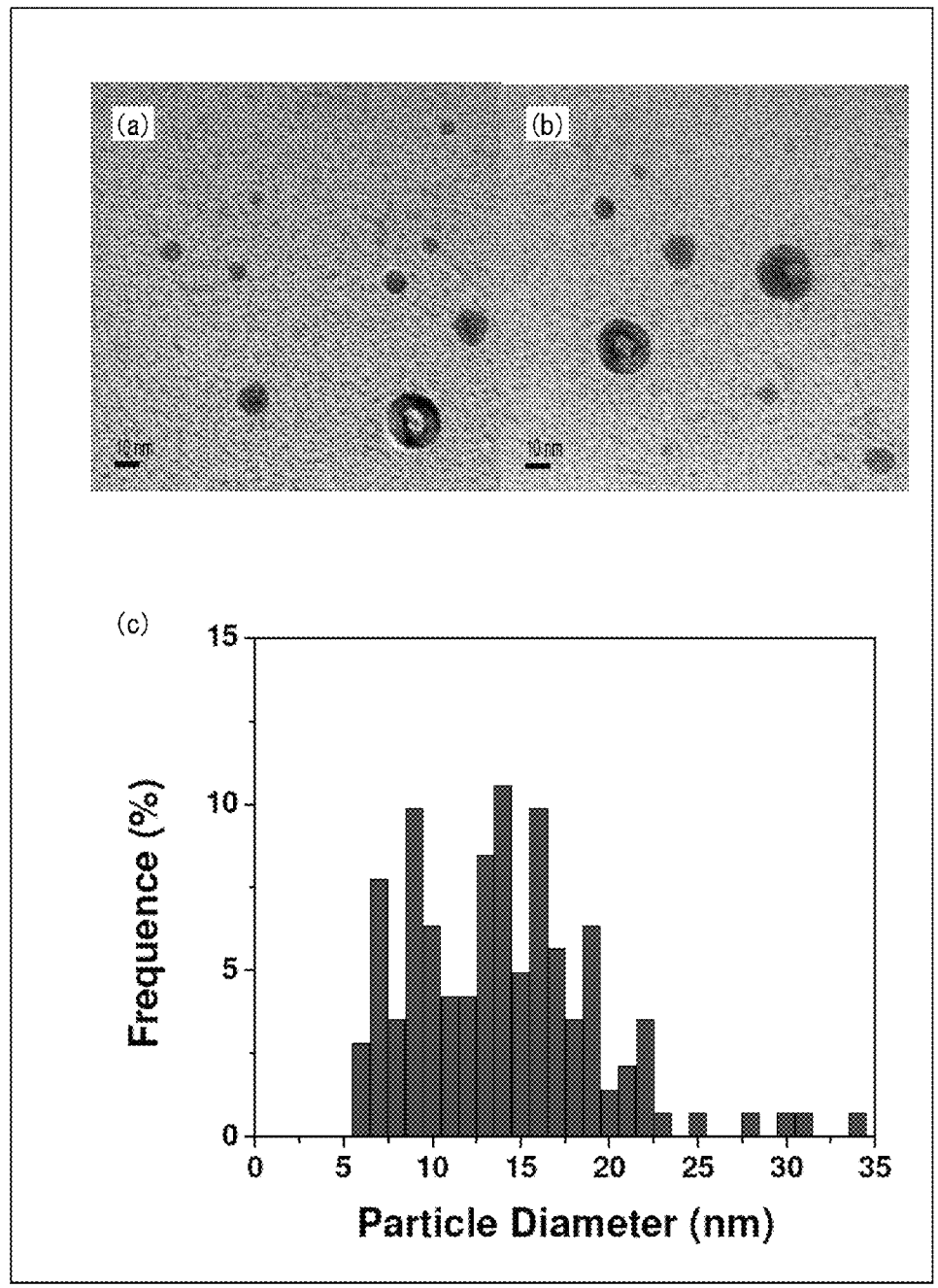
FIGS. 8($a$) and 8($b$) are TEM micrographs of InN core-only nanoparticles, FIG. 8($c$) is a size histogram of InN core-only nanoparticles.
Figure 9A:
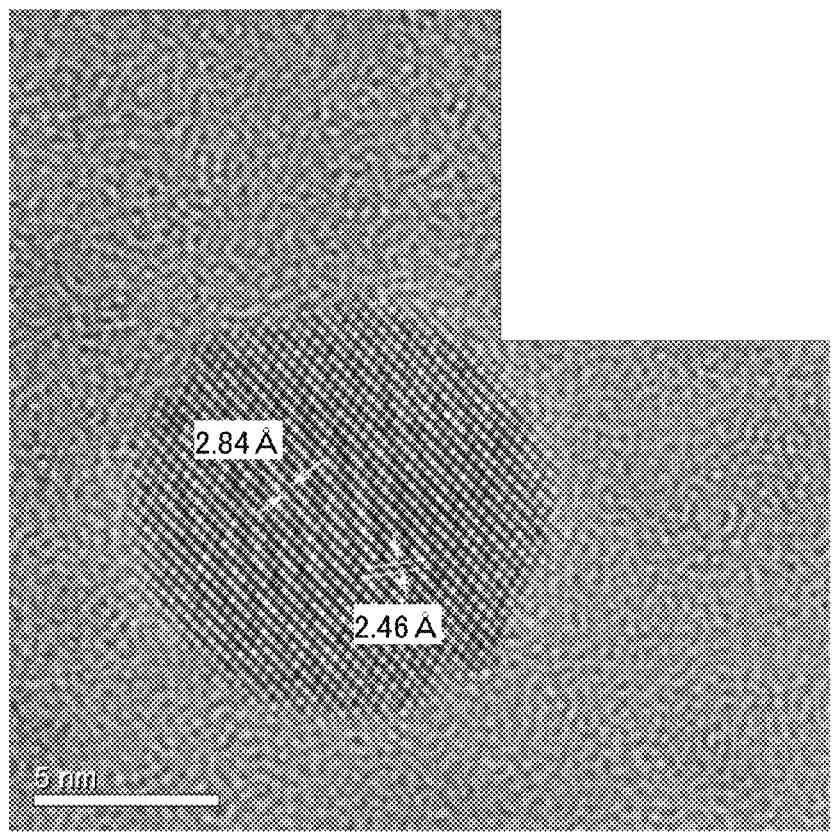
FIG. 9($a$) is an HRTEM image of an InN core-only nanoparticle.
Figure 9B:
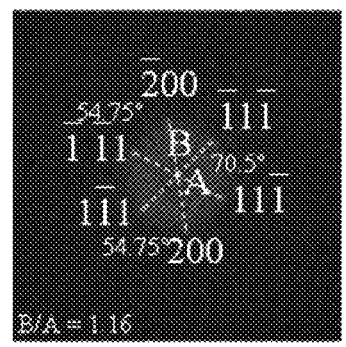

Core-only InN nanocrystals prepared by a method similar to that described in example 7 but omitting the treatment with zinc diethyl dithiocarbamate were isolated by precipitation with ethanol and redissolved in toluene. The toluene solution was drop cast onto a holey carbon TEM grid. The TEM images in FIGS. 8(a) and 8(b) show a number of individual InN core only nanocrystals. Over 100 such nanocrystals were measured to give the size histogram illustrated in FIG. 8(c); the nanocrystals were found to range in size from 6 nm to 34 nm with a mean diameter of 12.7 nm. The high resolution TEM (HRTEM) image shown in FIG. 9(a) shows one such nanocrystal. FIG. 9(a) is an HRTEM image of an InN coreonly nanoparticle with a particle diameter of 11 nm. The HRTEM image shows the nanocrystal to be highly crystalline and to have a cubic crystal structure. The nanoparticle exhibits a cubic crystalline structure. The observed lattice spacings are consistent with those expected for cubic indium nitride. The structure is further confirmed by the Fourier transform of FIG. 9(a), as shown in FIG. 9(b), which is again consistent with the nanocrystal being composed of cubic indium nitride.

Figure 10:
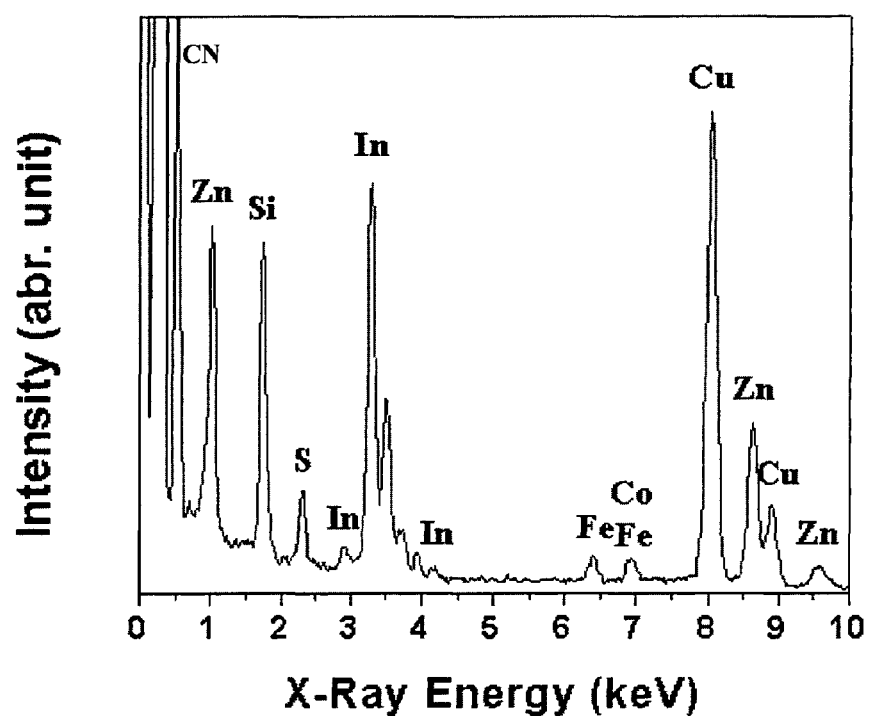
FIG. 10 is an EDX spectrum of an InN core-only nanoparticle.

FIG. 10 shows an EDX (energy-dispersive X-ray spectroscopy) spectrum of the core-only InN nanocrystal and confirms the presence of indium and nitrogen, together with zinc and sulfur from the capping agents. The other elements observed come from either the instrument or the TEM grid.

Figure 11A:
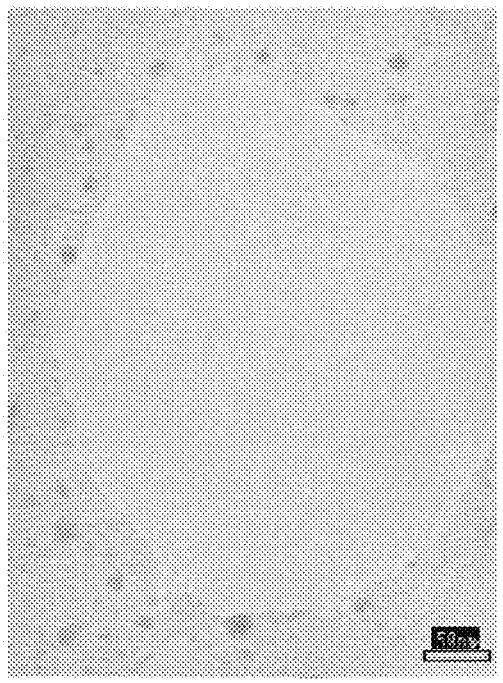
FIG. 11($a$) is a TEM micrograps of InN—ZnS core-shell nanoparticles.
Figure 11B:
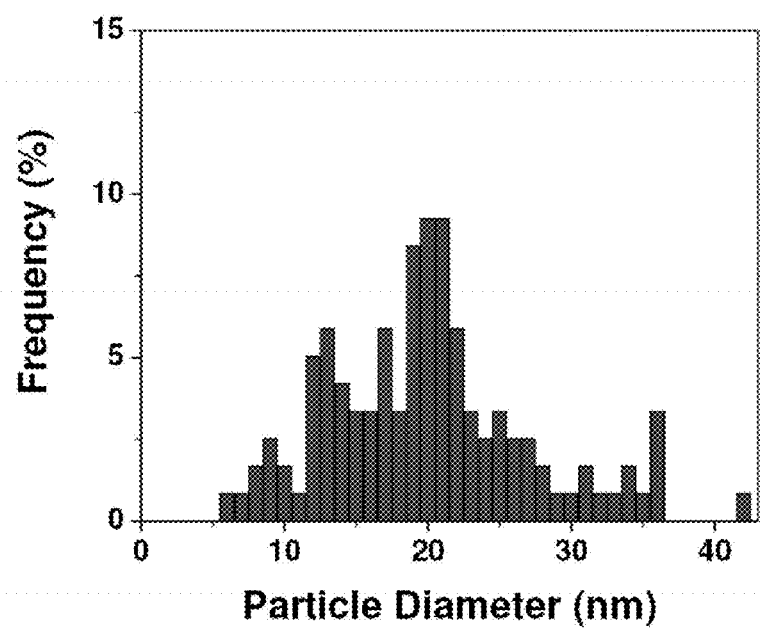

Core-shell InN-zinc sulfide nanocrystals prepared as described in example 7 were isolated by precipitation with ethanol and redissolved in toluene. The solution was drop cast onto a holey carbon TEM grid. The TEM images in FIG. 11(a) show a number of individual InN—ZnS core-shell nanocrystals. Over 100 such nanocrystals were measured to give the size histogram illustrated in FIG. 11(b). The nanocrystals were found to range in size from 6 nm to 42 nm with a mean diameter of 19.4 nm. By comparison, the core-only InN core only material has a size distribution from 6-34 nm with a mean of 12.7 nm—this illustrates that the growth of the ZnS shell has caused an increase in the average size of the nanocrystals as expected.

Figure 12A:
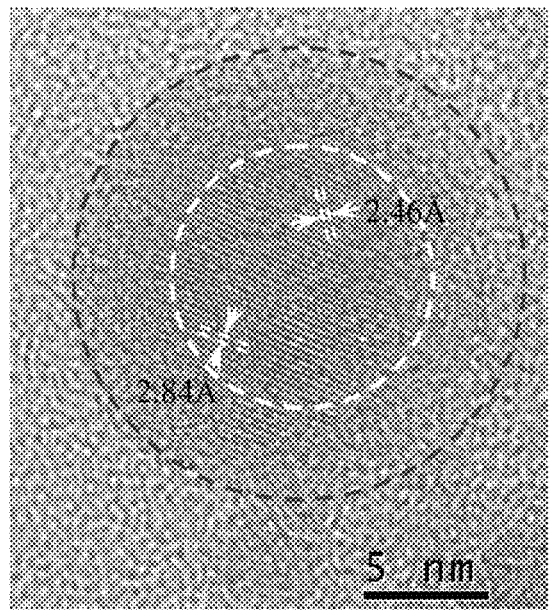
FIG. 12($a$) is an HRTEM image of an InN—ZnS core-shell nanoparticle.
Figure 12B:
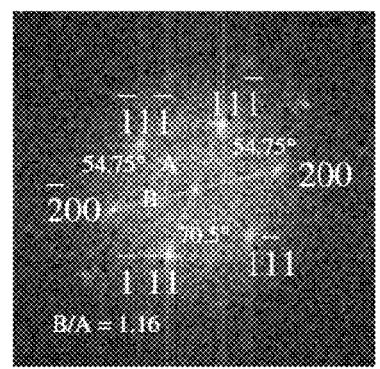

The high resolution TEM image shown in FIG. 12(a) shows one such nanocrystal. FIG. 12(a) is an HRTEM image of the core region of an InN—ZnS core-shell nanoparticle with a particle diameter of 17 nm (core diameter 10 nm). The HRTEM image shows the nanocrystal core to be highly crystalline and to have a cubic crystal structure. The observed lattice spacings are consistent with those expected for cubic indium nitride. An amorphous ZnS shell can also be observed. The structure is further confirmed by the Fourier transform of FIG. 12(a), as shown in FIG. 12(b), which is again consistent with the nanocrystal core being composed of cubic indium nitride.

Figure 13A:
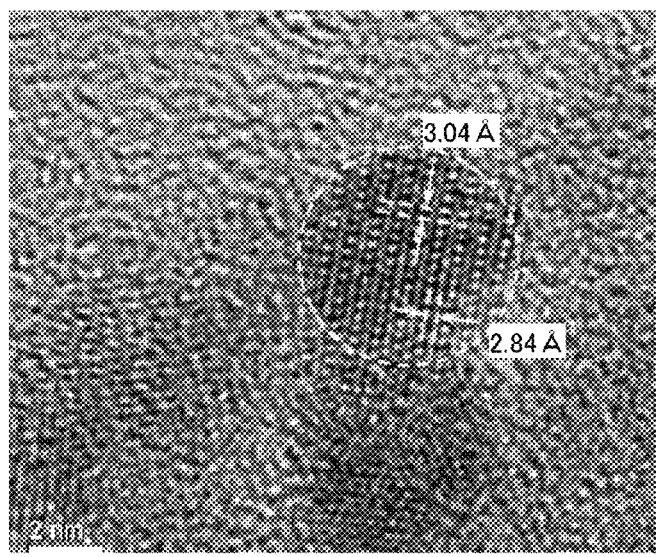
FIG. 13($a$) is an HRTEM image of an InN—ZnS core-shell nanoparticle.
Figure 13B:
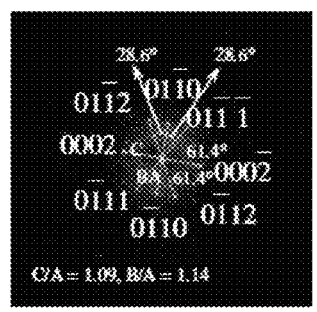

FIG. 13(a) shows a high resolution TEM image of a smaller nanocrystal, and this has a hexagonal structure (it is not possible to resolve the ZnS shell on this particle). FIG. 13(a) is an HRTEM image of the core region of an InN—ZnS core-shell nanoparticle with a particle diameter of 6 nm (the shell is not resolvable). The Fourier transform of FIG. 13(a), as shown in FIG. 13(b), is consistent with the core being composed on hexagonal indium nitride.

Figure 14:
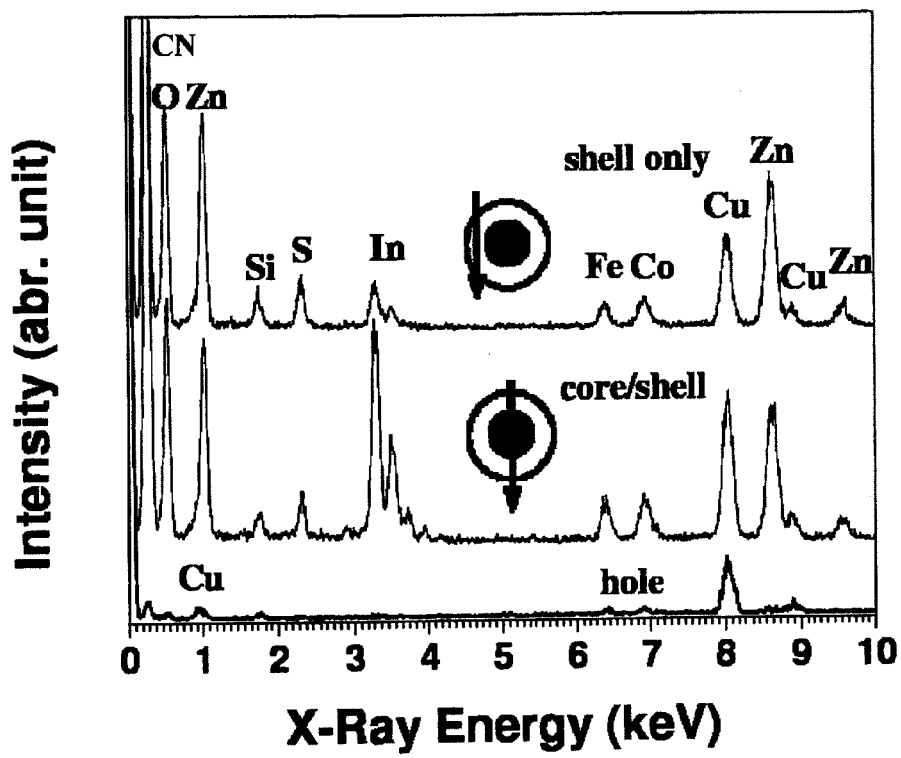
FIG. 14 shows EDX spectra from the core and the shell of an InN—ZnS core-shell nanoparticle.
Figure 15:
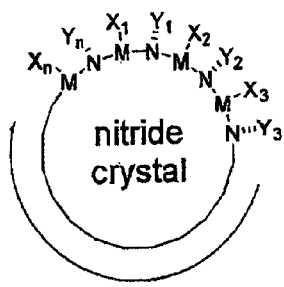
FIG. 15 shows a generalized chemical structure of a highly emissive nitride nanocrystal produced in accordance with the present invention.

FIG. 14 shows EDX spectra obtained with a narrow, focused probe beam for the core-shell InN—ZnS nanocrystals having a core diameter of 7 nm and an overall diameter (a particle diameter) of 15 nm. In the upper spectrum the beam passes though just the shell of the nanocrystal and shows this to contain mainly zinc and sulfur as expected. In the middle spectrum the beam passes though both the core and shell of the nanocrystal and, compared to the upper trace (for the shell), more indium is observed—as would be expected. The bottom trace shows the background spectrum obtained when the beam is not passing though the particle.

Example 8

InGaN Nanocrystals

Gallium iodide (113 mg, 0.25 mmol), indium iodide (124 mg, 0.25 mmol), sodium amide (390 mg, 10 mmol), hexadecane thiol (153 µl, 0.5 mmol), zinc stearate (316 mg, 0.5 mmol) and 1-octadecene (40 ml) were heated rapidly to 225° C. and maintained at 225° C. Samples (0.25 ml) were removed after 20, 40 and 60 minutes and diluted with cyclohexane, and the PLQY was measured giving values of 14%, 11% and 10.5% for the 20, 40 and 60 minute samples respectively. It can be seen that addition of gallium iodide to the reaction mixture increase the PLQY of the resultant nanocrystals, presumably due to the incorporation of gallium into the nanocrystals.

Example 9

InGaN—ZnS Core-Shell Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. After maintaining the mixture at 225° C. for 60 minutes the mixture was cooled to room temperature and centrifuged to remove any insoluble material. The resultant darkly coloured solution was decanted from the solids and further treated with zinc diethyl dithiocarbamate (1 g, 2.7 mmol) at 175° C. for 60 minutes. The mixture was cooled to room temperature and any insoluble material was removed by centrifugation to leave a solution of InGaN—ZnS core-shell nanocrystals. The PLQY of the nanocrystals was measured to be 18%—indicating that growth of a ZnS shell on InGaN nanocrystals improves the PLQY and stability over time of the nanocrystals.

Example 10

InGaN—ZnS Core-Shell Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. After maintaining the mixture at 225° C. for 20 minutes the mixture was cooled to room temperature and centrifuged to remove any insoluble material. The resultant highly coloured solution was decanted from the solids and a 4 ml sample was treated with zinc diethyldithiocarbamate (100 mg, 0.27 mmol) for 40 minutes at 175° C. The resulting nanocrystals had a PLQY of 23%—again indicating that growth of a ZnS shell on InGaN nanocrystals improves the PLQY and stability.

Example 11

InGaN—GaN Core-Shell Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. After maintaining the mixture at 225° C. for 20 minutes the mixture was cooled to room temperature and centrifuged to remove any insoluble material. 20 ml of the resulting solution was further treated with gallium iodide (113 mg, 0.25 mmol) and sodium amide (185 mg, 5 mmol), heated to 225° C. and maintained at 225° C. for 20 minutes. The resulting nanocrystals were measured to have a PLQY of 28%. This indicates that the growth of a gallium nitride shell onto InGaN nanocrystals improves the PLQY to a greater extent than does a zinc sulfide shell.

Example 12

InGaN—GaN—ZnS Core-Shell-Shell Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. After maintaining the mixture at 225° C. for 20 minutes the mixture was cooled to room temperature and centrifuged to remove any insoluble material. 20 ml of the resulting solution was further treated with gallium iodide (113 mg, 0.25 mmol) and sodium amide (185 mg, 5 mmol) and heated to 225° C. for 20 minutes. The resulting solution was centrifuged to remove any insoluble material and then treated with zinc diethyldithiocarbamate (500 mg, 1.35 mmol), heated to 175° C. and maintained at 175° C. for a period of 60 minutes. The resulting nanocrystals were measure to have a PLQY of 21.5%. This is an example of growth of a ZnS shell onto GaN coated InGaN nanocrystals, leading to a core-shell-shell structure. As in other core-shell structures, the shell improves the stability over time of the nanocrystals.

In the above examples, the reaction temperature is 225° C. or 250° C. The fabrication method of the present invention does not however require these specific reaction temperatures. It is however generally preferable that the reaction temperature is at least 150° C.—in general, the higher the reaction temperature the better is the crystal quality of the resultant nitride nanocrystals, so that a reaction temperature of at least 150° C. is generally preferable. Moreover while, for some combinations of constituents, it is expected that acceptable quality crystals may be obtained with reaction temperatures lower than 150° C. and possibly with reaction temperatures as low as room temperature, at temperature below 150° C. the reaction becomes very slow. Thus, even if a reaction temperature below 150° C. would lead to acceptable crystal quality, it would generally be preferable to use a reaction temperature of 150° C. or above so that a long reaction time was not needed.

Furthermore, experiments have shown that reaction temperatures above 250° C.-300° C. can lead to reduction in the PLQY of the material. Examples of results for the PLQY for different reaction temperatures are shown in Table 1 below. The results of Table 1 relate to growth of InN—ZnS core-shell nanocrystals where the nitride core is grown at the temperature stated in Table 1 and the ZnS shell is grown at 175° C. Apart from the reaction temperature at which the InN core was grown, no other parameters were changed.

TABLE 1

| Temperature (° C.) | PLQY (%) |
| --- | --- |
| 220 | 12 |
| 227 | 12 |
| 233 | 11 |
| 240 | 8 |

As can be seen from Table 1, when the InN cores were grown at 220° C. or 227° C. nanostructures with a PLQY of 12% were obtained, and when the InN cores were grown at 233° C. nanostructures with a PLQY of 11% were obtained. However, when the InN cores were grown at 240° C., the PLQY of the obtained nanostructures had fallen to 8%.

Taking account of the increase in reaction speed and crystal quality as the reaction temperature increases, and of the decrease in PLQY at higher growth temperatures as shown in Table 1, it is generally preferable that the growth temperature is at least 150° C. and is no more than 300° C. Moreover, it is particularly preferable if the growth temperature is 210° C. or greater, and is less than approximately 250° C., as this will lead to good crystal quality and a high PLQY.

Where the reaction is performed in a solvent, it is of course desirable for the solvent to have a boiling point greater than the desired reaction temperature to avoid the need to perform the reaction under pressure. Therefore it is preferable to use a solvent with a boiling point greater that 200° C., or even greater than 250° C. One suitable solvent is diphenyl ether, as this has a boiling point of 259° C. at atmospheric pressure and so is suitable for reaction temperatures up to approximately 230° C., but the invention is not limited to this solvent. Another suitable solvent is 1-octadecene, which has a boiling point of 316° C. at atmospheric pressure. As noted above, if the reaction temperature is close to the boiling point of the solvent that is used a condenser may be required to condense the vapour from the reaction vessel and return it to the reaction vessel.

It can therefore be seen that the present invention makes possible the fabrication of nitride nanoparticles, in particular Group III metal nitride nanocrystals, that have good light-emissive properties. Nanoparticles/nanocrystals having particular optical properties (such as a desired peak emission wavelength) can be obtained by appropriate choice of the reaction period before the nanocrystals are recovered from the solution.

Nanoparticles/nanocrystals obtained by a method of the invention may then undergo further processing, for example to allow them to be used in any of the applications mentioned above. As examples, nanocrystals obtained by a method of the invention may undergo further processing to incorporate them into a light source (for example a light source in which the nanocrystals are illuminated by light from an exciting light source) or to provide one or more shells of different material(s) around the nanocrystals to provide a core-shell structure (in which the nanocrystals provide the core). Any suitable processing steps may be applied to nanocrystals obtained by a method of the invention, and these further processing steps will not be described in detail.

A method of the invention may also be used to grow a nitride layer around a core to form a core-shell structure. The core may be fabricated by any suitable process, and the core is not limited to a nitride material.

Preferred embodiments of the invention have been described with reference to nanocrystals. The nanoparticles of the invention are not however limited to nanocrystals, and may be nanoparticles with an amorphous structure.

The invention has been described with reference to fabrication of light-emissive nitride nanoparticles/nanocrystals. The invention is not however limited to this, and may also be applied to manufacture of nitride nanoparticles/nanocrystals that are not light-emissive.

The invention claimed is:

1. A method of manufacturing a light-emissive nitride nanoparticle, the method comprising:
reacting in a first solvent (i) at least one Group III metal iodide with (ii) at least one Group I metal amide in the presence of (iii) at least one capping agent having an electron-accepting group to produce a nitride crystal, at least two dimensions of the nitride crystal being of a nanoscale dimension, the nitride crystal having the general formula:

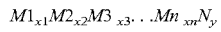

wherein M1, M2, M3...Mn are different Group III metals, the numbers x1, x2, x3... xn are the relative quantities of the Group III metals in the nitride crystal and range from 0 to 1, where x1+x2+x3+...xn =1, and y is the quantity of nitrogen and y =1;
wherein the Group I metal of the metal amide is selected from among Li, Na and K; and
wherein the capping agent comprises a zinc carboxylate, the zinc passivating nitrogen atoms of the nitride crystal at the surface of the nitride crystal, thereby increasing the photoluminescent quantum yield of the light-emissive nitride nanoparticle.

2. A method as claimed in claim 1 wherein the step of reacting is further carried out in the presence of a capping agent having an electron-donating group.

3. A method as claimed in claim 2 wherein the electron-donating group is selected from the group consisting of: phosphines, phosphine oxides, carboxylic acids, carboxylates, amines, sulfonates, esters, thiols and thiolates.

4. A method as claimed in claim 1 wherein the at least one Group I metal amide is soluble in the first solvent.

5. A method as claimed in claim 1 wherein the first solvent has a boiling point of at least 200° C.

6. A method as claimed in claim 1 wherein the at least one capping agent includes a group for promoting solubility of the nitride nanoparticle in a second solvent.

7. A method as claimed in claim 6 wherein the second solvent is a polar solvent.

8. A method as claimed in claim 7 wherein the second solvent is methanol, ethanol, or water.

9. A method as claimed in claim 6 wherein the second solvent is a non-polar solvent.

10. A method as claimed in claim 9 wherein the second solvent is toluene, hexane, or an ether.

11. A method as claimed in 6 wherein the group for promoting solubility of the nitride nanoparticle is an alkyl chain.

12. A method as claimed in claim 1, wherein the step of reacting is carried out at a temperature between 150° C. and 300° C.

13. A method as claimed in claim 12, wherein the step of reacting is carried out at a temperature between 210° C. and 250° C.

14. A method as claimed in claim 1 and comprising controlling the length of the period for which the at least one Group III metal iodide, the at least one Group I metal amide and the at least one capping agent are reacted thereby to obtain a nitride nanoparticle having a desired dimension.

15. A method of forming a core-shell nanoparticle, the method comprising forming a light-emissive nitride nanoparticle according to a method as defined in claim 1, wherein the nitride crystal forms a core of the nanoparticle; and further comprising forming a shell around the core.

16. A light-emissive nitride nanoparticle manufactured by a method defined in claim 1.

17. A core-shell nanoparticle manufactured by a method defined in claim 15.

18. A core-shell nanoparticle as claimed in claim 17, wherein the shell comprises ZnS.

19. A light-emissive nitride nanoparticle as claimed in claim 16 and having a photoluminescence quantum yield of at least 1%.

20. A light-emissive nitride nanoparticle as claimed in claim 16 and having a photoluminescence quantum yield of at least 5%.

21. A light-emissive nitride nanoparticle as claimed in claim 16 and having a photoluminescence quantum yield of at least 10%.

22. A light-emissive nitride nanoparticle as claimed in claim 16 and having a photoluminescence quantum yield of at least 20%.

* * * * *